United States Patent
Ono et al.

(10) Patent No.: US 7,982,388 B2
(45) Date of Patent: Jul. 19, 2011

(54) LIGHT EMITTING ELEMENT AND DISPLAY DEVICE

(75) Inventors: Masayuki Ono, Osaka (JP); Reiko Taniguchi, Osaka (JP); Shogo Nasu, Hyogo (JP); Eiichi Satoh, Osaka (JP); Kenji Hasegawa, Osaka (JP); Toshiyuki Aoyama, Osaka (JP); Masaru Odagiri, Hyogo (JP)

(73) Assignee: Panasonic Corporation, Osaka (JP)

( * ) Notice: Subject to any disclaimer, the term of this patent is extended or adjusted under 35 U.S.C. 154(b) by 232 days.

(21) Appl. No.: 12/374,976

(22) PCT Filed: Jul. 24, 2007

(86) PCT No.: PCT/JP2007/064498
§ 371 (c)(1),
(2), (4) Date: Jan. 23, 2009

(87) PCT Pub. No.: WO2008/013171
PCT Pub. Date: Jan. 31, 2008

(65) Prior Publication Data
US 2009/0206730 A1    Aug. 20, 2009

(30) Foreign Application Priority Data

Jul. 25, 2006  (JP) ................................ 2006-201482
Aug. 22, 2006  (JP) ................................ 2006-224915

(51) Int. Cl.
*H01J 1/62* (2006.01)
(52) U.S. Cl. ...................................... 313/503; 313/506
(58) Field of Classification Search .................. 313/498, 313/503, 504, 506
See application file for complete search history.

(56) References Cited

U.S. PATENT DOCUMENTS

| | | |
|---|---|---|
| 6,639,354 B1 | 10/2003 | Kojima et al. |
| 2006/0176244 A1 | 8/2006 | Hori et al. |
| 2006/0181197 A1 | 8/2006 | Nago et al. |
| 2008/0191607 A1 | 8/2008 | Kawai et al. |

FOREIGN PATENT DOCUMENTS

| | | |
|---|---|---|
| JP | 52-033491 | 3/1977 |
| JP | 52-033491 | 8/1977 |

(Continued)

OTHER PUBLICATIONS

International Preliminary Report on Patentability and Written Opinion of the International Searching Authority, issued in corresponding International Patent Application No. PCT/JP2007/064498, mailed Feb. 5, 2009.

*Primary Examiner* — Vip Patel
(74) *Attorney, Agent, or Firm* — McDermott Will & Emery LLP (57) ABSTRACT

This light emitting device includes a pair of electrodes at least one of which is transparent or translucent, and a phosphor layer that is sandwiched between the electrodes and has a polycrystalline structure made of a first semiconductor material, and in this structure, a second semiconductor material different from the first semiconductor material is segregated on a grain boundary of the polycrystalline structure. The first semiconductor material and the second semiconductor material preferably have semiconductor structures of conduction types that are different from each other. Moreover, the first semiconductor material preferably has an n-type semiconductor structure, and the second semiconductor material preferably has a p-type semiconductor structure. Furthermore, in the case where the first semiconductor material is a zinc-based material containing zinc, at least one of the paired electrodes is preferably made of a material containing zinc.

21 Claims, 7 Drawing Sheets

FOREIGN PATENT DOCUMENTS

| | | |
|---|---|---|
| JP | 53-108293 | 9/1978 |
| JP | 54-008080 | 4/1979 |
| JP | 62-254394 | 11/1987 |
| JP | 6-036876 | 2/1994 |
| JP | 6-196262 | 7/1994 |
| JP | 8-306485 | 11/1996 |
| JP | 2000-349333 | 12/2000 |
| WO | WO 2005/004546 A1 | 1/2005 |
| WO | WO 2005/004548 A1 | 1/2005 |
| WO | WO 2006/025259 A1 | 3/2006 |

LIGHT EMITTING ELEMENT AND DISPLAY DEVICE

RELATED APPLICATIONS

This application is the U.S. National Phase under 35 U.S.C. §371 of International Application No. PCT/JP2007/064498, filed on Jul. 24, 2007, which in turn claims the benefit of Japanese Application No. 2006-201482, filed on Jul. 25, 2006 and Japanese Application No. 2006-224915, filed on Aug. 22, 2006, the disclosures of which Applications are incorporated by reference herein.

BACKGROUND OF THE INVENTION

1. Technical Field

The present invention relates to an electroluminescence (hereinafter, referred to simply as EL) element and a display device using the EL element.

2. Background Art

In recent years, among many kinds of flat-face-type display devices, high expectations have been drawn to display devices using electroluminescence elements. The display device using the El elements has such characteristics that it exerts a spontaneous light emitting property, is superior in visibility, has a wide viewing angle and is fast in response. Moreover, the currently developed EL elements include inorganic EL elements that use an inorganic material as a luminous body and organic EL elements that use an organic material as a luminous body.

In the inorganic EL element, for example, an inorganic phosphor such as zinc sulfide is used as a luminous body, and electrons accelerated by as high an electric field as $10^6$ V/cm are caused to collide with the luminescence center of the phosphor so as to be excited, and light is emitted as those electrons are alleviated. Moreover, the inorganic EL elements include dispersion-type EL elements in which a phosphor layer formed by dispersing powdered phosphor in a polymer organic material or the like is prepared, with electrodes being formed on the upper and lower sides thereof, and thin-film-type EL elements in which two layers of dielectric layers are formed between a pair of electrodes, and a thin-film phosphor layer, sandwiched between the two dielectric layers, is formed. Among these, the former dispersion-type EL elements have low luminance with a short life, although they are easily manufactured, with the result that the application thereof has been limited. On the other hand, of the latter thin-film-type EL elements, those elements having a double insulating structure, proposed by Inokuchi, et al. in 1974, have been proven to have high luminance and a long life, and have been put into practical use as vehicle-use displays and the like, as described in Japanese Patent Publication No. S52-033491.

Figure 13:
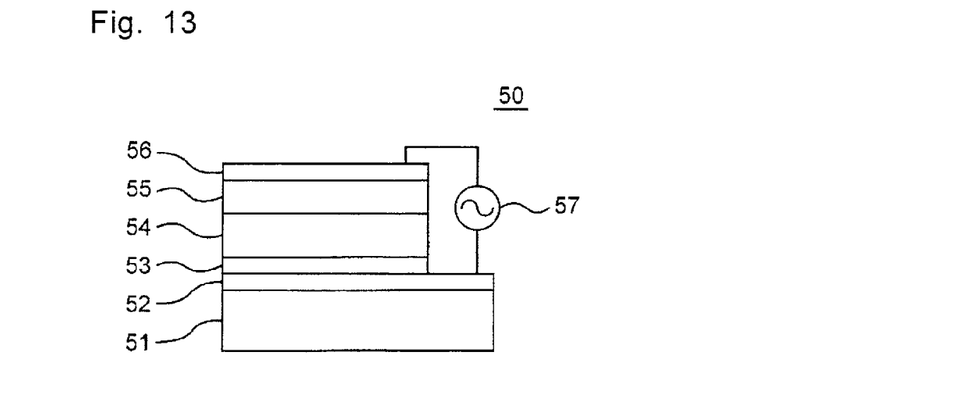
FIG. 13 is a schematic structural diagram showing an inorganic EL element of a conventional example, as viewed in a direction perpendicular to the light emitting face.

Referring to FIG. 13, the following description is made to discuss conventional inorganic EL elements. FIG. 13 is a cross-sectional view perpendicular to the light emitting face of a thin-film-type EL element 50 having the double insulating structure. This EL element 50 has a structure in which on a substrate 51, a transparent electrode 52, a first dielectric layer 53, a phosphor layer 54, a second dielectric layer 55, and a back electrode 56 are laminated in this order. An AC voltage is applied between the transparent electrode 52 and the back electrode 56 from an AC power supply 57 so that light emission is taken out from the transparent electrode 52 side. The dielectric layers 53 and 55 have a function of regulating an electric current flowing through the phosphor layer 54 so that they can prevent dielectric breakdown of the EL element 50 and function to provide a stable light-emitting characteristic. Moreover, a display device of a passive matrix driving system has been known in which transparent electrodes 52 and back electrodes 56 are patterned into stripes so as to be orthogonal to each other, and by applying a voltage to specific selected pixels in the matrix, a desired pattern displaying operation is carried out.

Dielectric materials to be used as the dielectric layers 53 and 54 preferably have a high permittivity, with high insulation resistance and high withstand voltage, and in general, dielectric materials having a perovskite structure, such as $Y_2O_3$, $Ta_2O_5$, $Al_2O_3$, $Si_3N_4$, $BaTiO_3$, $SrTiO_3$, $PbTiO_3$, $CaTiO_3$, and $Sr(Zr, Ti)O_3$, are used. In general, inorganic phosphor materials to be used as the phosphor layer 54, on the other hand, have a structure in which an insulating material crystal is used as a host crystal doped with an element serving as a luminescence center. Since those materials that are stable physically as well as chemically are used as the host crystal, inorganic EL elements are superior in reliability and achieve a life for 30,000 hours or more. For example, the phosphor layer is mainly composed of ZnS and doped with a transition metal element or a rare-earth element, such as Mn, Cr, Tb, Eu, Tm, and Yb, so that the light emission luminance can be improved, as described in Japanese Patent Publication No. S54-8080).

In general, a compound semiconductor located between Group 12 to Group 16, such as ZnS used as the phosphor layer 54, has a polycrystalline structure. For this reason, there are many grain boundaries in the phosphor layer 54. Since these grain boundaries serve as diffusing bodies relative to electrons accelerated through electric field application, the exciting efficiency of the luminescence center is extremely lowered. Moreover, in the grain boundaries, a lattice strain becomes greater due to deviations and the like of the crystal orientation, and there are many non-irradiation recombination centers that give adverse effects on the EL light emission. Because of these influences, the light emission luminance of inorganic EL elements is low, failing to be practically used.

In order to solve the above-mentioned problems, methods for making greater the grain size of the crystal grain diameter of the phosphor layer and for improving the crystalline property thereof have been proposed. In accordance with the technique described in Japanese Patent Laid-open Publication No. H06-36876, an inorganic EL element is designed such that a first electrode has a specific crystal orientation, a first dielectric layer laminated thereon has a crystal orientation equivalent to that of the first electrode and a phosphor layer further laminated thereon has a crystal orientation equivalent to that of the first dielectric layer; thus, the grain boundary relative to the thickness direction is suppressed so that light emission luminance is improved. Moreover, in accordance with the technique described in Japanese Patent Laid-open Publication No. H06-196262, in the phosphor layer to which a rare-earth element has been added, by specifying the concentration of the rare earth element, the number of crystal growing cores in the initial growing period is set to a uniform and appropriate value. With this arrangement, pillar-shaped crystals having uniform particle sizes can be formed from the initial stage of the growth so that the light emission luminance can be improved.

SUMMARY OF THE INVENTION

In the case where the above-mentioned inorganic EL element is utilized as a high quality display device such as a television, luminance as high as 300 cd/m$^2$ is required. Although the above-mentioned proposal provides a certain degree of effect, the light emission luminance is 150 cd/cm$^2$, which is still at an insufficient level. Moreover, for emitting light, it is normally necessary to apply a voltage of several 100 V. Moreover, in order to maintain the light emission, it is necessary to apply a high frequency AC voltage at a high frequency of several 10 kHz, resulting in problems that an active element such as a thin-film transistor is not applicable, and that an expensive driving circuit is required.

An object of the present invention is to provide a display device that is capable of emitting light at a low voltage and has high luminance and high efficiency The above-mentioned problems can be solved by the light emitting device of the present invention. That is, the light emitting device in accordance with the present invention includes:

a pair of electrodes at least one of which is transparent or translucent; and a phosphor layer that is sandwiched between the electrodes and has a polycrystalline structure made of a first semiconductor material. A second semiconductor material that is different from the first semiconductor material is segregated on a grain boundary of the polycrystalline structure.

The first semiconductor material and the second semiconductor material preferably have semiconductor structures of conduction types that are different from each other. Moreover, the first semiconductor material preferably has an n-type semiconductor structure, and the second semiconductor material preferably has a p-type semiconductor structure. Furthermore, the first semiconductor material and the second semiconductor material may be compound semiconductors. In addition, the first semiconductor material may be a compound semiconductor located between Group 12 and Group 16.

Moreover, the first semiconductor material may have a cubic crystal structure. Furthermore, the first semiconductor material may have at least one kind of element selected from the group consisting of Cu, Ag, Au, Al, Ga, In, Mn, Cl, Br, I, Li, Ce, Pr, Nd, Pm, Sm, Eu, Gd, Tb, Dy, Ho, Er, Tm, and Yb.

Furthermore, the polycrystalline structure made of the first semiconductor material has an average crystal grain size in a range from 5 nm to 500 nm.

Moreover, in the case where the first semiconductor material is a zinc-based material containing zinc, at least one of the paired electrodes is preferably made of a material containing zinc. In this case, the material containing zinc that forms one of the electrodes mainly contains zinc and contains at least one selected from the group consisting of aluminum, gallium, titanium, niobium, tantalum, tungsten, copper, silver, and boron.

Moreover, a supporting substrate that is made in contact with at least one of faces of the electrode so as to support the electrode may be further included.

Furthermore, a color conversion layer, which is made face to face with the paired electrodes and disposed in front of the phosphor layer in a taking-out direction of light emission therefrom, may be further included.

A display device in accordance with the present invention includes:

a substrate;

a plurality of scanning electrodes extended on the substrate in a first direction in parallel with one another;

a plurality of data electrodes extended in a second direction perpendicular to the scanning electrodes, in parallel with one another; and at least one phosphor layer sandwiched between the scanning electrodes and the data electrodes. In this structure, at least one group of the scanning electrodes and the data electrodes is transparent or translucent, and the phosphor layer has a polycrystalline structure made of a first semiconductor material, with a second semiconductor material different from the first semiconductor material being segregated on a grain boundary of the polycrystalline structure.

The first semiconductor material and the second semiconductor material preferably have semiconductor structures of conduction types that are different from each other. Moreover, the first semiconductor material preferably has an n-type semiconductor structure, and the second semiconductor material preferably has a p-type semiconductor structure. Furthermore, the first semiconductor material and the second semiconductor material may be compound semiconductors. The first semiconductor material may be a compound semiconductor located between Group 12 and Group 16.

Moreover, the first semiconductor material may have a cubic crystal structure. Furthermore, the first semiconductor material may contain at least one kind of element selected from the group consisting of Cu, Ag, Au, Al, Ga, In, Mn, Cl, Br, I, Li, Ce, Pr, Nd, Pm, Sm, Eu, Gd, Tb, Dy, Ho, Er, Tm, and Yb.

Moreover, the first semiconductor material may have a polycrystalline structure having an average crystal grain size in a range from 5 nm to 500 nm.

Furthermore, the second semiconductor material may be any of $Cu_2S$, ZnS, ZnSe, ZnSSe, ZnSeTe, ZnTe, GaN, and InGaN.

Also, in the case where the first semiconductor material is a zinc-based material containing zinc, at least one of the paired electrodes is preferably made of a material containing zinc. In this case, the material containing zinc that forms one of the electrodes preferably mainly contains zinc oxide and contains at least one kind selected from the group consisting of aluminum, gallium, titanium, niobium, tantalum, tungsten, copper, silver, and boron.

Moreover, the display device may further include a supporting substrate that is made in contact with at least one of faces of the electrode so as to support the electrode.

The display device may further include a color conversion layer that is made face to face with the electrodes and disposed in front of a taking-out direction of light emission.

In accordance with the present invention, it becomes possible to provide a light emitting device and a display device that is capable of emitting light at a low voltage and has high luminance and high efficiency.

BRIEF DESCRIPTION OF THE DRAWINGS

The present invention will become readily understood from the following description of preferred embodiments thereof made with reference to the accompanying drawings, in which like parts are designated by like reference numeral and in which.

DETAILED DESCRIPTION OF THE PREFERRED EMBODIMENTS

Referring to the attached drawings, the following description is made to discuss the best mode for carrying out the present invention. In the drawings, virtually the same members are indicated by the same reference numerals.

First Embodiment

<Schematic Structure of EL Element>

Figure 1:
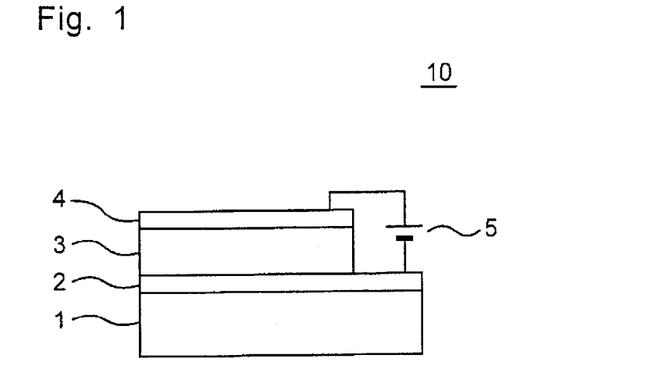
FIG. 1 is a schematic structural diagram showing a light emitting device in accordance with a first embodiment of the present invention, as viewed in a direction perpendicular to the light emitting face.

FIG. 1 is a schematic structural diagram showing a cross section perpendicular to a light emitting face of a light emitting device 10 of the present embodiment, as viewed in a direction in parallel with the light emitting face. This light emitting device 10 includes a substrate 1, a transparent electrode 2 serving as a first electrode formed on the substrate 1, a phosphor layer 3 formed on the transparent electrode 2, and a back electrode 4 serving as a second electrode that is formed on the phosphor layer 3 so as to be face to face with the transparent electrode 2. The phosphor layer 3 is sandwiched between the transparent electrode 2 serving as the first electrode and the back electrode 4 serving as the second electrode. Moreover, the substrate 1, which supports the entire light emitting device 10, is provided adjacent to the transparent electrode 2. Further, the transparent electrode 2 and the back electrode 4 are electrically connected to each other with a power supply 5 interposed therebetween. In this light emitting device 10, upon being supplied with power from the power supply 5, a potential difference occurs between the transparent electrode 2 and the back electrode 4, so that a voltage is applied to the phosphor layer 3. Phosphors of the phosphor layer 3 sandwiched between the transparent electrode 2 and the back electrode 4 emit light, and the light 7 is transmitted through the transparent electrode 2 and the substrate 1 and taken out of the light emitting device 10. In the present embodiment, a DC power supply is used as the power supply 5. The polarity of the power supply 5 is not limited to the example of FIG. 1, and the power supply 5 may be connected to a reverse polarity.

With this light emitting device 10, the phosphor layer 3 has a polycrystalline structure made of a first semiconductor material 21, and this structure has a feature that a second semiconductor material 23 is segregated on a grain boundary 22 of this polycrystalline structure. In the present embodiment, the first semiconductor material 21 is an n-type semiconductor material, and the second semiconductor material 23 is a p-type semiconductor material. In this manner, by the p-type semiconductor material segregated on the grain boundary of the n-type semiconductor material, the injecting property of holes is improved, so that the recombination-type light emission of electrons and holes is exerted efficiently, and a light emitting device that emits light with high luminance at a low voltage can be achieved.

The light emitting device 10 is not limited to the above-mentioned structure and may have modified structures, e.g., in which a plurality of phosphor layers 3 are formed, a plurality of dielectric layers are formed between the electrode and the phosphor layer 3 so as to regulate an electric current, an AC power supply is used for driving, the transparent electrode and the back electrode are replaced with each other, both the transparent electrode and the back electrode are made transparent relative to light emission, the back electrode 4 is formed into a black electrode, a structure is further provided in which all the portions or some portions of the light element 10 are sealed, and a structure is further provided in which a color conversion layer or the like that converts the color of light emission from the phosphor layer 3 is further disposed in front thereof in a taking-out direction of the light emission.

The following description is made to discuss each component member of the light emitting device 10.

<Substrate>

The substrate 1 is formed by using a material that can support each of the layers formed thereon and has a high electric insulating property. Moreover, for taking out light from the substrate 1 side, the material needs to have a light transmitting property relative to a wavelength of light emitted from the phosphor. Exemplary materials thereof include a glass such as Corning 1737, quartz, and ceramic. In order to prevent alkali ions or the like contained in a normal glass from giving adverse effects on the light emitting device, a non-alkaline glass and a soda lime glass formed by coating a glass surface with alumina or the like as an ion barrier layer may be used. Moreover, any of combinations of polyester-based, polyethylene terephthalate-based, and poly-chrolotrifluoro-ethylene-based resin with nylon 6 may be used, and a fluorine resin-based material, and a resin film such as polyethylene, polypropylene, polyimide, and polyamide, may also be used. In the case where a resin film is used, those materials having good durability, flexibility, transparency, electrical insulating property, and moisture preventive property are preferably used. The above-mentioned materials are only listed by way of example, and the materials for the substrate 1 are not particularly limited thereto.

In the case of a structure in which light is not taken out from the substrate 1 side, the above-mentioned light-transmitting property is not necessary, and those materials having no light transmitting property may also be used. Examples thereof include a metal substrate, a ceramic substrate and a silicon wafer substrate, each having an insulating layer formed on the surface thereof.

<Electrodes>

Electrodes include the transparent electrode 2 on the light-take-out side and the back electrode 4 on the other side. As shown in FIG. 1, a description will be given to a structure in which the transparent electrode 2 is formed on the substrate 1; however, the present invention is not limited thereto, and for example, as shown by a light emitting device 10a according to another example in FIG. 3, a back electrode 4 may be formed on the substrate 1, and the phosphor layer 3 and the transparent electrode 2 may be successively formed thereon. Alternatively, both of the transparent electrode 2 and the back electrode 4 may be formed as transparent electrodes. In this case, the power supply 5 may be connected to a reverse polarity to that of FIG. 1.

First, the transparent electrode 2 will be described. Any material may be used for the transparent electrode 2 as long as it has a light transmitting property so as to allow light emission generated in the phosphor layer 3 to be taken out, and in particular, the material preferably has a high transmittance in a visible light area. Moreover, the material preferably has a low resistance as an electrode and preferably also has a good contact property relative to the substrate 1 and the phosphor layer 3. Preferable examples of materials for the transparent electrode 2 include those ITO materials ($In_2O_3$ doped with $SnO_2$, referred also to as indium-tin-oxide), metal oxides mainly containing InZnO, ZnO, $SnO_2$, or the like, metal thin films such as Pt, Au, Pd, Ag, Ni, Cu, Al, Ru, Rh, and Ir, and conductive polymers such as polyaniline, polypyrrole, PEDOT/PSS, and polythiophene; however, the material is not particularly limited thereto. These transparent electrodes 2 may be formed by using a film-forming method, such as a sputtering method, an electron beam vapor deposition method, and an ion plating method, so as to improve the transparency or to lower the resistivity. Moreover, after the film-forming process, the film may be subjected to a surface treatment such as plasma treatment or the like so as to control the resistivity. The film thickness of the transparent electrode 2 is determined based upon the required sheet resistance value and visible light transmittance.

The carrier concentration of the transparent electrode 2 is preferably set in a range from 1E17 to 1E22 $cm^{-3}$. Moreover, in order to obtain performance as the transparent electrode 2, the volume resistivity of the transparent electrode 2 is preferably set to 1E-3 Ωcm or less, and the transmittance is preferably set to 75% or more in a wavelength range from 380 to 780 nm. Furthermore, the refractive index of the transparent electrode 2 is preferably set to 1.85 to 1.95. In the case where the film thickness of the transparent electrode 2 is 30 nm or less, it is possible to achieve a film that is solid and has stable characteristics.

Moreover, any of commonly known conductive materials may be applied for the back electrode 4. Preferably, the material is preferably good in adhesion to the phosphor layer 3. Preferable examples thereof include metal oxides such as ITO, InZnO, ZnO, and $SnO_2$, metals such as Pt, Au, Pd, Ag, Ni, Cu, Al, Ru, Rh, Ir, Cr, Mo, W, Ta, and Nb, and laminated products thereof, or conductive polymers such as polyaniline, polypyrrole, and PEDOT[poly(3,4-ethylenedioxythiophene)]/PSS (polystyrene sulfonate), or conductive carbon.

Moreover, the transparent electrode 2 and the back electrode 4 may be formed in such a manner as to cover the entire face inside each layer, or a plurality of stripe-shaped electrodes may be formed inside each layer. Moreover, both of the transparent electrode 2 and the back electrode 4 may be formed as a plurality of stripe-shaped electrodes, such that each stripe-shaped electrode of the transparent electrode 2 and all the stripe-shaped electrodes of the back electrode 4 are formed in a twisted positional relationship, and such that a projected contour of each stripe-shaped electrode of the transparent electrode 2 on the light emitting face and projected contours of all the stripe-shaped electrodes of the back electrode 4 are made to intersect with each other. In this case, a display can be formed in which, by applying a voltage between paired electrodes respectively selected from the stripe-shaped electrodes of the transparent electrode 2 and the stripe-shaped electrodes of the back electrodes 4, a predetermined position is caused to emit light.

<Phosphor Layer>

Figure 2:
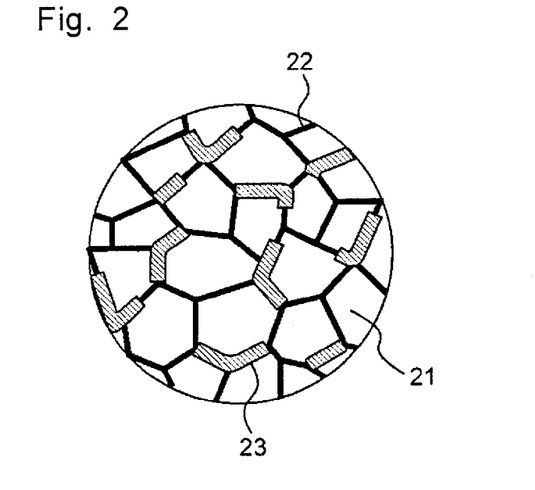
FIG. 2 is an enlarged schematic diagram showing a structure of a phosphor layer of the light emitting device in accordance with the first embodiment of the present invention.

The following description is made to discuss the phosphor layer 3. FIG. 2 is a schematic structural diagram in which one portion of a cross section of the phosphor layer 3 is enlarged. The phosphor layer 3 has a polycrystalline structure made of the first semiconductor material 21, in which the second semiconductor material 23 is segregated on the grain boundary 22 of the polycrystalline structure. As the first semiconductor material 21, a semiconductor material that has a number of carriers as electrons and exhibits an n-type conductivity is used. On the other hand, as the second semiconductor material 23, a semiconductor material that has a number of carriers as holes and exhibits a p-type conductivity is used. Also, the first semiconductor material 21 and the second semiconductor material 23 are electrically joined to each other.

As the first semiconductor material 21, those materials having a band gap size ranging from a near ultraviolet area to a visible light area (from 1.7 eV to 3.6 eV) are preferably used, and more preferably, those materials having a band gap size ranging from the near ultraviolet area to a blue color area (from 2.6 eV to 3.6 eV) are used. Specific examples thereof include: the aforementioned compounds between Group 12 to Group 16 elements, such as ZnS, ZnSe, ZnTe, CdS, and CdSe, and mixed crystals of these (for example, ZnSSe or the like), compounds between Group 2 to Group 16 elements, such as CaS and SrS, and mixed crystals of these (for example, CaSSe or the like), compounds between Group 13 to Group 15 elements, such as AlP, AlAs, GaN, and GaP, and mixed crystals of these (for example, InGaN or the like), and mixed crystals of the above-mentioned compounds, such as ZnMgS, CaSSe, and CaSrS. Moreover, chalcopyrite-type compounds, such as $CuAlS_2$, may be used. Furthermore, as the poly-crystal made of the first semiconductor material 21, those having a cubic crystal structure in the main portion thereof are preferably used. In addition, one or a plurality of kinds of atoms or ions selected from the group consisting of the following elements may be contained as additives: Cu, Ag, Au, Al, Ga, In, Mn, Cl, Br, I, Li, Ce, Pr, Nd, Pm, Sm, Eu, Gd, Tb, Dy, Ho, Er, Tm, and Yb. The light emission color from the phosphor layer 3 is also determined by the kinds of these elements.

Meanwhile, as the second semiconductor material 23, any of $Cu_2S$, ZnS, ZnSe, ZnSSe, ZnSeTe, ZnTe, GaN, and InGaN may be used. These materials may contain one kind or a plurality of kinds of elements selected from N, Cu, and In as additives used for imparting the p-type conductivity.

The feature of the light emitting device 10 according to the present embodiment lies in that the phosphor layer 3 has a polycrystalline structure made of the n-type semiconductor material 21, with the p-type semiconductor material 23 being segregated on the grain boundary 22 of the polycrystalline structure. In the conventional inorganic EL, by enhancing the crystalline property of the phosphor layer, electrons accelerated by a high electric field are prevented from being scattered; however, in general, since ZnS, ZnSe, or the like exhibits the n-type conductivity, supply of holes is not sufficient, with the result that light emission with high luminance derived from recombination of an electron and a hole is not expected. On the other hand, when the crystal grains of the phosphor layer are grown, the grain boundary is uniquely expanded as well, as long as it is not a single crystal. In the case of a conventional inorganic EL element that is applied with a high voltage, the grain boundary in the film thickness direction forms a conductive path, resulting in a problem of reduction in voltage resistance. In contrast, as a result of hard studies, the present inventors have found that, in a phosphor layer 3 having a polycrystalline structure made of the n-type semiconductor material 21, by providing a structure in which the p-type semiconductor material 23 is segregated on the grain boundary 22 of the polycrystalline structure, the injecting property of holes is improved by the p-type semiconductor material segregated on the grain boundary. Moreover, they have also found that by scattering the segregated portions in the phosphor layer 3 with a high concentration, the recombination-type light emission of electrons and holes can be efficiently generated. Thus, it becomes possible to achieve a light emitting device that emits light with high luminance at a low voltage, and consequently to complete the present invention. Moreover, by introducing a donor or an acceptor, free electrons and holes captured by the acceptor can be recombined, free holes and electrons captured by the donor can be recombined, and light emission of the paired donor and acceptor can also be carried out. Furthermore, since other kinds of ions are located closely, light emission derived from energy transfer can also be carried out.

Moreover, in the case where a zinc-based material such as ZnS is used as the first semiconductor material 21 of the phosphor layer 3, an electrode made of a metal oxide containing zinc, such as ZnO, AZO (zinc oxide doped with, for example, aluminum) and GaZO (zinc oxide doped with, for example, gallium), is preferably used as at least one of the transparent electrode 2 and the back electrode 4. The present inventors have found that, by adopting a combination of a specific first semiconductor material 21 and a specific transparent electrode 2 (or a back electrode 4), light can be produced with high efficiency.

That is, when attention is drawn to a work function in the transparent electrode 2 (or the back electrode 4), the work function of ZnO is 5.8 eV, while the work function of ITO (indium-tin-oxide) that has been conventionally used as the transparent electrode is 7.0 eV. On the other hand, since the work function of a zinc-based material that is the first semiconductor material of the phosphor layer 3 is 5 to 6 eV, the work function of ZnO is closer to the work function of the zinc-based material in comparison with that of ITO; therefore, the resulting advantage is that the ion injecting property into the phosphor layer 3 is improved. The same holds true in the case where AZO or GZO, which is a zinc-based material, is used as the transparent electrode 2 (or the back electrode 4) in the same manner.

Figure 4A:
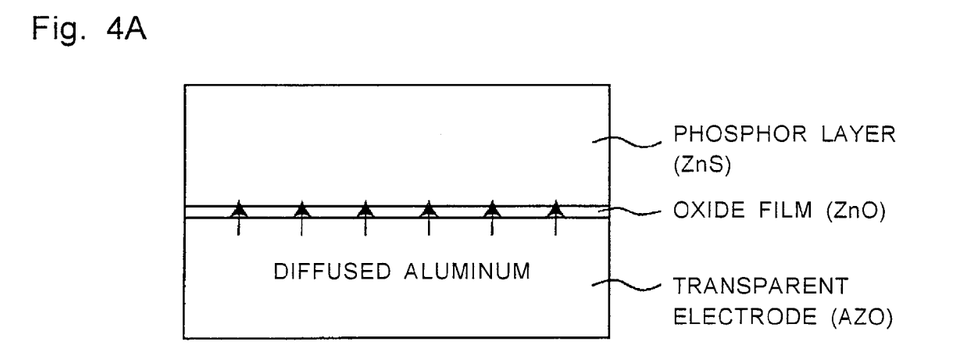
FIG. 4A is a schematic diagram showing the vicinity of an interface between a phosphor layer made of ZnS and a transparent electrode (or a back electrode) made of AZO.
Figure 4B:
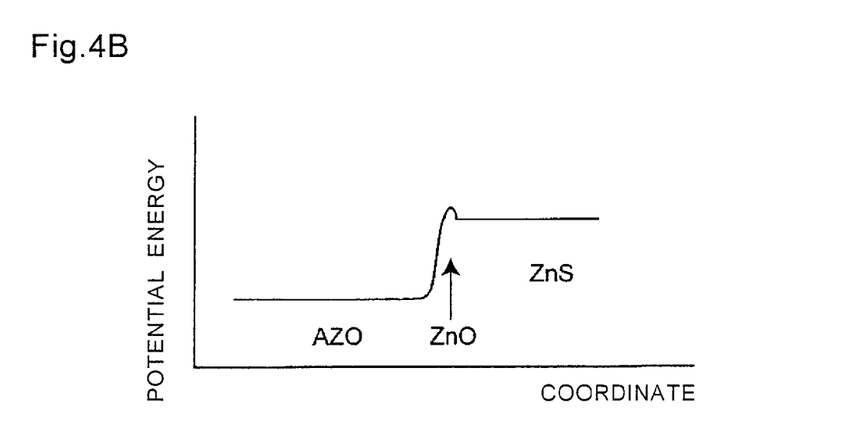
FIG. 4B is a schematic diagram illustrating the change of potential energy of FIG. 4A.
Figure 5A:
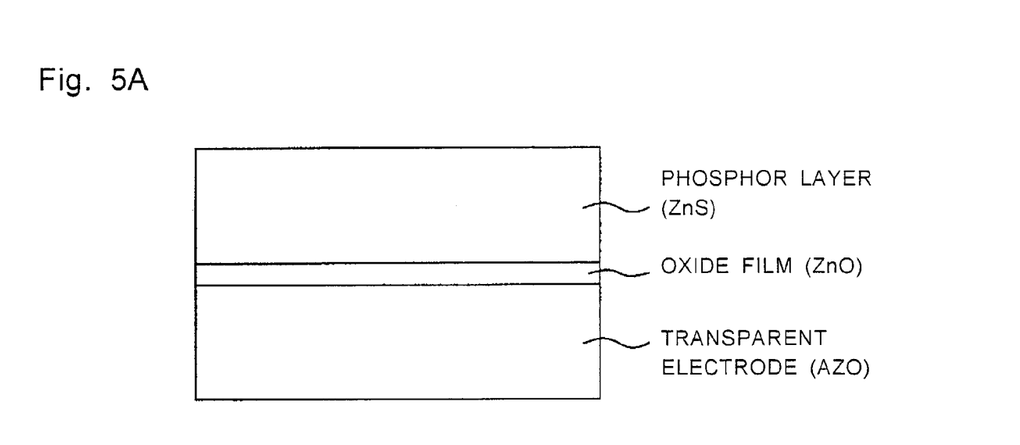
FIG. 5A is a schematic diagram showing an interface between a phosphor layer made of ZnS and a transparent electrode made of ITO as a comparative example.
Figure 5B:
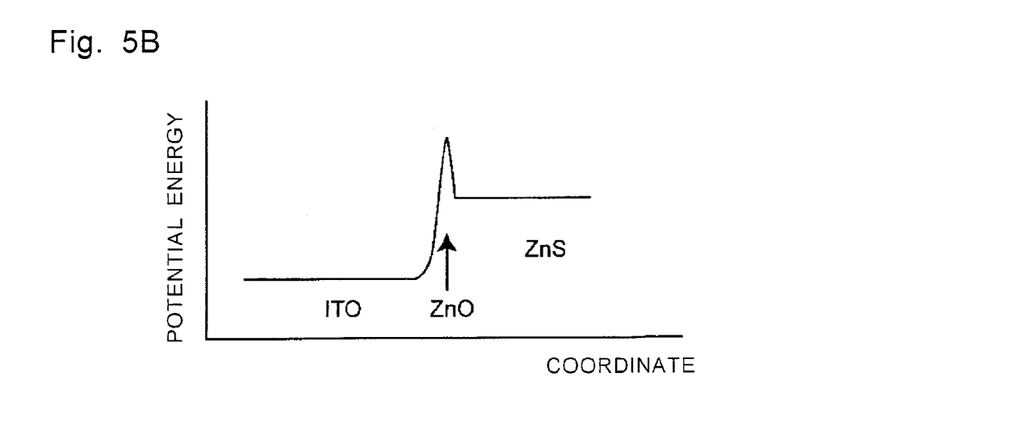
FIG. 5B is a schematic diagram illustrating the change of potential energy of FIG. 5A.

FIG. 4A is a schematic diagram showing the vicinity of an interface between the phosphor layer 3 made of ZnS and the transparent electrode 2 (or the back electrode 4) made of AZO. FIG. 4B is a schematic diagram illustrating the change of potential energy of FIG. 4A. Moreover, FIG. 5A is a schematic diagram showing an interface between a phosphor layer 3 made of ZnS and a transparent electrode made of ITO as a comparative example. FIG. 5B is a schematic diagram illustrating the change of potential energy of FIG. 5A.

As shown in FIG. 4A, in the above-described preferable example, since the first semiconductor material 21 forming the phosphor layer 3 is made of a zinc-based material (ZnS) and since the transparent electrode 2 (or the back electrode 4) is made of a zinc oxide-based material (AZO), an oxide to be formed on the interface between the transparent electrode 2 (or the back electrode 4) and the phosphor layer 3 is a zinc oxide (ZnO). Moreover, on the interface, upon forming a film, the doping material (Al) is diffused so that a low resistance oxide film is formed. Moreover, the zinc oxide-based (AZO) transparent electrode 2 (or the back electrode 4) has a crystal structure in a hexagonal system, and since the zinc-based material (ZnS) serving as the first semiconductor material 21 forming the phosphor layer 3 also has a crystal structure of a hexagonal crystal or a cubic crystal, a strain exerted on the interface of the two layers is small to only cause a small energy barrier. Consequently, as shown in FIG. 4B, the change in potential energy becomes smaller.

In a comparative example, on the other hand, as shown in FIG. 5A, since the transparent electrode is made of ITO that is not a zinc-based material, the oxide film (ZnO) formed on the interface has a different crystal structure from that of ITO so that an energy barrier on the interface becomes larger. Therefore, as shown in FIG. 5B, the change in the potential energy becomes greater on the interface to cause reduction in the light emitting efficiency of the light emitting device.

As described above, in the case where a zinc-based material, such as ZnS and ZnSe, is used as the first semiconductor material of the phosphor layer 3, by combining it with the transparent electrode 2 (or the back electrode 4) made of a zinc oxide-based material, it becomes possible to provide a light emitting device having good light emitting efficiency.

In the above-described example, the description has been given by exemplifying AZO doped with aluminum and GZO doped with gallium as the transparent electrode 2 (or the back electrode 4) containing zinc; however, the same effects can be obtained by using zinc oxide doped with at least one kind selected from aluminum, gallium, titanium, niobium, tantalum, tungsten, copper, silver, and boron.

Figure 6:
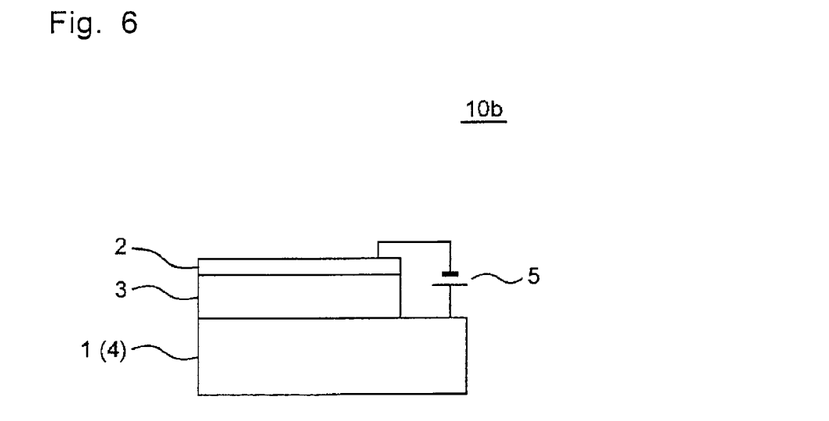
FIG. 6 is a schematic structural diagram of a still another example of the light emitting device of the first embodiment in accordance with the present invention, as viewed in a direction perpendicular to the light emitting face.

Referring to FIG. 6, the following description is made to discuss a manufacturing method for still another example of the light emitting device 10b according to the first embodiment. As shown in FIG. 6, a substrate 1(4) that also serves as the back electrode 4 is used as the light emitting device 10b of this another example, and a phosphor layer 3 and a transparent electrode 2 are successively laminated on the substrate 1(4). Moreover, a type of material mainly containing ZnS is used as the first semiconductor material 21 of the phosphor layer 3. In the case where the first and second semiconductor materials 21 and 23 of the phosphor layer 3 are formed by using other materials than the above-mentioned ones, the same manufacturing methods can be used.

(1) A conductive silicon substrate 1(4) to be also used as a substrate for the back electrode 4 is prepared.
(2) Next, a phosphor layer 3 is formed on the substrate 1(4) also used as the back electrode 4. In the case of the phosphor layer of a thin film, the above-mentioned phosphor layer can be film-formed by using a sputtering method, an electron beam vapor deposition method, a resistance heating vapor deposition method, an ion plating method, a CVD method or the like. That is, after mixing and film-forming an n-type semiconductor material and a p-type semiconductor material, or after laminating the respective thin films of the two kinds of semiconductor materials, this is fired in vacuum so that the p-type semiconductor is deposited on a grain boundary of the polycrystalline structure of the n-type semiconductor. More specifically, the phosphor layer 3 is formed by using the electron beam vapor deposition device through the following two processes.

a) Powdered ZnS and $Cu_2S$ are each charged into a plurality of evaporating sources, and an electron beam is applied to each of the materials in vacuum (about $10^{-6}$ Torr) so as to be film-formed on the substrate 1 as a phosphor layer 3. At this time, the substrate temperature is set to 200° C. so that ZnS and $Cu_2S$ are commonly vapor deposited.

b) After forming the common vapor deposition film of ZnS and $Cu_2S$, the film is subjected to firing at 700° C. for about one hour in a sulfur atmosphere. Thus, a phosphor layer 3 having a polycrystalline structure of ZnS with $Cu_xS$ being segregated on the grain boundary on the polycrystalline structure, is formed. By examining the film of this phosphor layer 3 by using the X-ray diffraction and the SEM, the polycrystalline structure with fine ZnS crystal grains and the segregated portion of $Cu_xS$ can be observed. Although the reason has not been clarified, it is considered that a phase separation occurred between ZnS and $Cu_xS$, with the result that the above-mentioned segregated structure was formed.

(3) ITO is film-formed on the phosphor layer 3 as a transparent electrode 2 (pattern having a square shape of 1 mm in each side) by using a sputtering method.

Through the above-mentioned processes, a light emitting device 10b of another example of the present first embodiment can be obtained.

Figure 3:
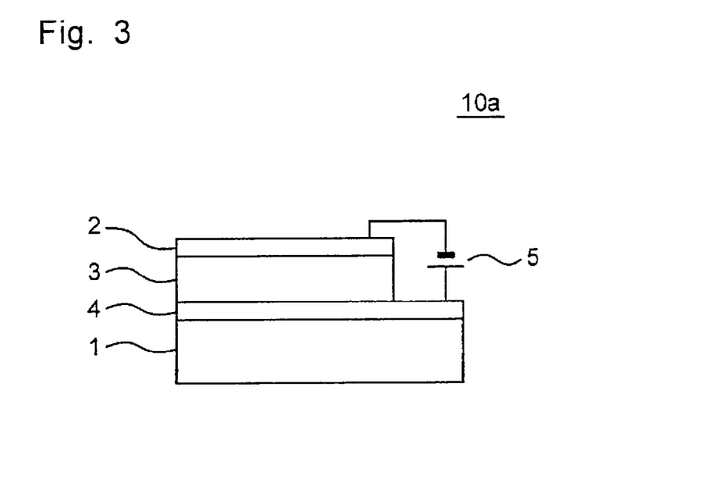
FIG. 3 a schematic structural diagram showing another light emitting device in accordance with the first embodiment of the present invention, as viewed in a direction perpendicular to the light emitting face.

In the light emitting device 10b of the above-described example, the substrate 1(4) is also used as the back electrode 4; however, the present invention is not limited to this example, and as indicated by a light emitting device 10a shown in FIG. 3, the substrate 1 and the back electrode 4 may be formed separately. Moreover, in the manufacturing method of the light emitting device 10b of the above-described example, a conductive silicon substrate that is opaque with respect to light emission was used as the substrate 1(4) also used as the back electrode 4 such that the phosphor layer 3 and the transparent electrode 2 were formed from the substrate 1(4) side; however, the order of laminated layers is not particularly limited thereto. For example, as indicated by the light emitting device 10 shown in FIG. 1, a substrate 1 that is transparent with respect to light emission may be used, and the layers of the transparent electrode 2, the phosphor layer 3, and the back electrode 4 may be formed on the substrate 1 in this order. Moreover, in order to stabilize the characteristics of the light emitting device, after the formation of the device, an aging treatment or the like may be carried out on the device.

The transparent electrode 2 and the back electrode 4 of this light emitting device 10b were connected to a DC power supply 5 so that light emission evaluation was carried out, and as a result, light emission was initiated at an applied voltage of 15 V, and a light emission luminance of about 600 cd/m2 was exerted at 35 V.

<Effects>

In accordance with the light emitting device according to the present embodiment, light emission was obtained at a voltage lower than that of the conventional inorganic EL element, with high luminance.

Second Embodiment

<Schematic Structure of Display Device>

Figure 7:
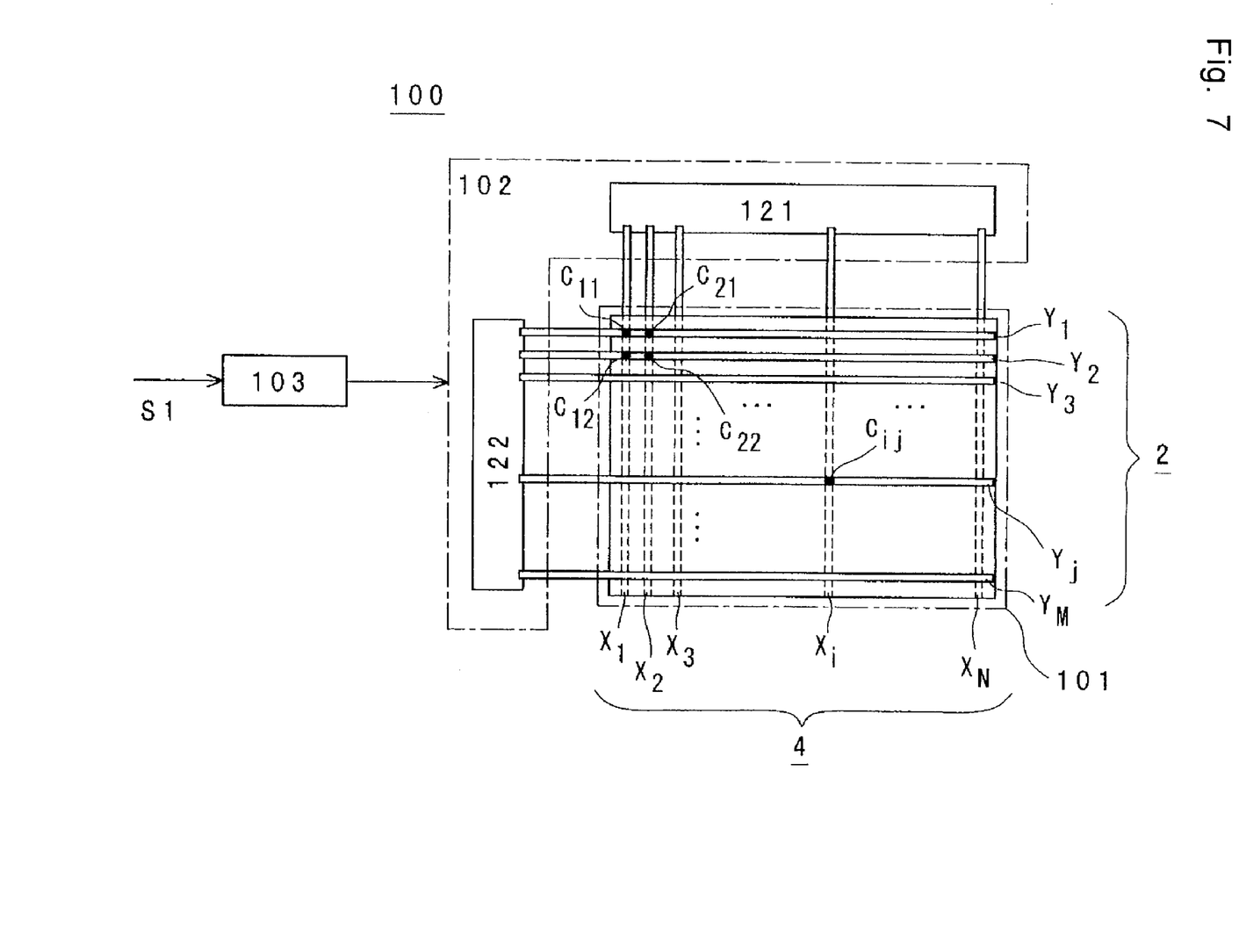
FIG. 7 is a block diagram showing a structure of a passive matrix-type display device in accordance with a second embodiment of the present invention.
Figure 10:
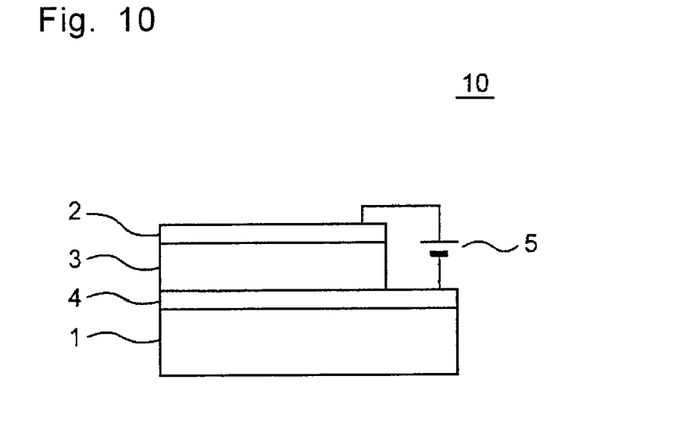
FIG. 10 is a schematic diagram showing a structure in which each pixel $C_{ij}$ of FIG. 9 is considered as one light emitting device.

FIG. 7 is a block diagram showing a schematic structure of a passive matrix-type display device 100 in accordance with a second embodiment of the present invention. This passive matrix-type display device 100 is configured by a display unit 101, driving means 102 for selectively driving each pixel $C_{ij}$ of the display unit 101, and a control unit 103 that controls the driving means 102 and supplies power thereto. In the present embodiment, a DC power supply, for example, as shown in FIG. 10, is used as a power supply for supplying power. Moreover, the driving unit 102 includes a data electrode driving circuit 121 that drives data electrodes $X_i$ and a scanning electrode driving circuit 122 that drives scanning electrodes $Y_j$.

Figure 8:
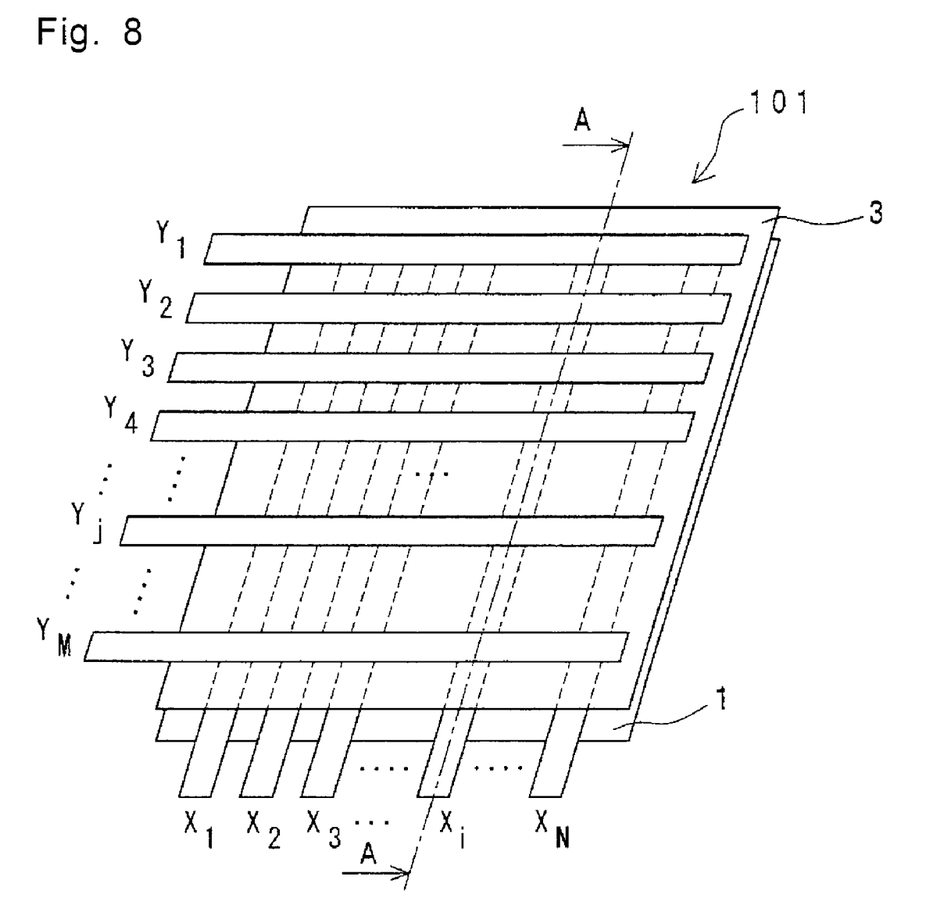
FIG. 8 is a perspective view showing a structure of a display unit constituting the display device of FIG. 7.

FIG. 8 is a perspective view showing the structure of the display unit 101. The display unit 101 includes a substrate 1, a plurality of data electrodes $X_1, X_2, X_3, \ldots X_i \ldots X_N$ that are extended and disposed in a first direction (a column direction in FIGS. 7 and 8) in parallel with one another, a phosphor layer 3, and a plurality of scanning electrodes $Y_1, Y_2, Y_3, \ldots Y_j \ldots Y_M$ that are extended and disposed in a second direction perpendicular to the first direction (a row direction in FIGS. 7 and 8) in parallel with one another.

A portion at which the paired data electrode $X_i$ and scanning electrode $Y_j$ intersect with each other is referred to as a pixel $C_{ij}$. In this display unit 101, N×M number of the pixels $C_{ij}$ are arrayed two-dimensionally. Moreover, the pixels $C_{ij}$ are indicated by their subscriptions i and j in the pixel coordinates thereof. For example, a pixel $C_{11}$ of FIG. 7 represents a pixel at which a data electrode $X_1$ and a scanning electrode $Y_1$ intersect with each other, a pixel $C_{21}$ represents a pixel at which a data electrode $X_2$ and a scanning electrode $Y_1$ intersect with each other, and a pixel $C_{12}$ represents a pixel at which the data electrode $X_1$ and the scanning electrode $Y_2$ intersect with each other. Therefore, the pixel $C_{11}$ and the pixel $C_{21}$ are connected to the scanning electrode $Y_1$, and the pixel $C_{12}$ is connected to the scanning electrode $Y_2$. On the other hand, the pixel $C_{11}$ and the pixel $C_{12}$ are connected to the data electrode $X_1$, and the pixel $C_{21}$ is connected to the data electrode $X_2$.

Figure 9:
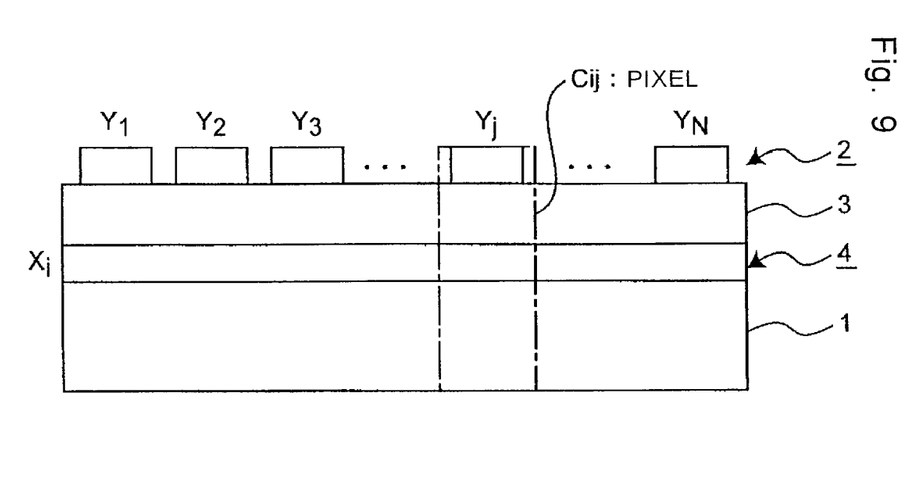
FIG. 9 is a cross-sectional view perpendicular to a light emitting face along an A-A line of FIG. 8.

FIG. 9 is a cross-sectional view perpendicular to the light emitting face along A-A line of FIG. 8. As shown in FIG. 9, each of the pixels $C_{ij}$ is configured by a data electrode $X_i$ (a back electrode 4), a phosphor layer 3, and a scanning electrode $Y_j$ (a transparent electrode 2) that are successively laminated on a substrate 1. Each pixel $C_{ij}$ corresponds to each EL element; therefore, the display unit 101 is considered as having a structure in which a plurality of EL elements are arrayed two-dimensionally. In the present embodiment, the phosphor layer 3 is formed as a layer continuously formed over the pixels $C_{ij}$; however, the present invention is not limited to this structure, and the phosphor layer 3 may be designed to be separately formed for each pixel $C_{ij}$. For example, the phosphor layer 3 may be separated for each of the pixels $C_{ij}$. Alternatively, an EL element array in which EL elements are separated for each of the pixels $C_{ij}$, except for the data electrodes $X_i$ and the scanning electrode $Y_j$, with each EL element being arranged two-dimensionally, may be used. In this case, all the pixels $C_{ij}$ at which N number of data electrodes $X_i$ and M number of scanning electrodes $Y_j$ intersect with one another have only to form EL elements.

FIG. 10 is a diagram schematically showing a structure in which each pixel $C_{ij}$ of FIG. 9 is supposed to form one EL element 10. This EL element 10 is configured by successively laminating a back electrode 4, a phosphor layer 3, and a transparent electrode 2 on a substrate 1, and a voltage is applied to the phosphor layer 3 by a DC power supply so that the phosphor layer 3 emits light. In the example, the back electrode 4 is associated with the data electrode $X_i$ and the transparent electrode 2 is associated with the scanning electrode $Y_j$. The relationship between the back electrode 4 and the transparent electrode 2 as well as between the data electrode $X_i$ and the scanning electrode $Y_j$ is not particularly limited to the above-described relationship, and the relationship may be reversed. Moreover, the order of laminating the layers may be reversed.

Figure 11:
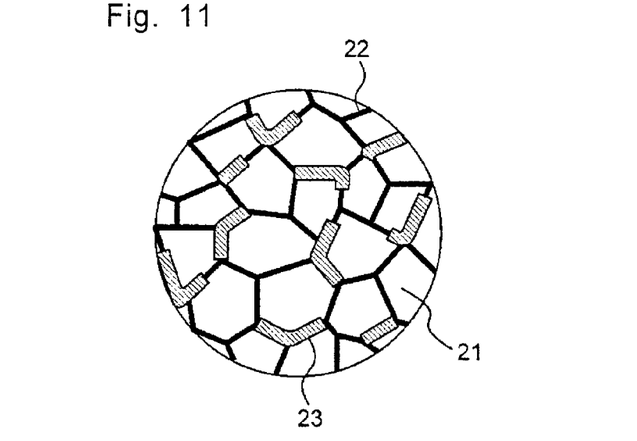
FIG. 11 is an enlarged schematic diagram showing a phosphor layer of a display device in accordance with the second embodiment of the present invention.

FIG. 11 shows a schematic structural diagram in which one portion of a cross section of the phosphor layer 3 is enlarged. In accordance with this display device 100, the phosphor layer 3 of each EL element of each pixel $C_{ij}$ has a polycrystalline structure made of the first semiconductor material 21 and has a characteristic structure in which a second semiconductor material 23 is segregated on the grain boundary 22 of the polycrystalline structure. In the present embodiment, the first semiconductor material 21 is an n-type semiconductor material, and the second semiconductor material 23 is a p-type semiconductor material. In this manner, by the p-type semiconductor material segregated on the grain boundary of the n-type semiconductor material, the injecting property of holes is improved, so that the recombination-type light emission of electrons and holes is exerted efficiently, and that a light emitting device 100 that can emit light with high luminance at a low voltage is achieved.

By film-forming the phosphor layers 3 using phosphors having different colors of RGB, a color display device can be obtained. Alternatively, light emitting units, each having a transparent electrode/phosphor layer/back electrode, may be laminated for respective colors of RGB. Moreover, in the case of a color display device of another example, after manufacturing a display device using a phosphor layer of a single color or two colors, the respective colors of RGB may be displayed by using color filters and/or color conversion filters.

Figure 12:
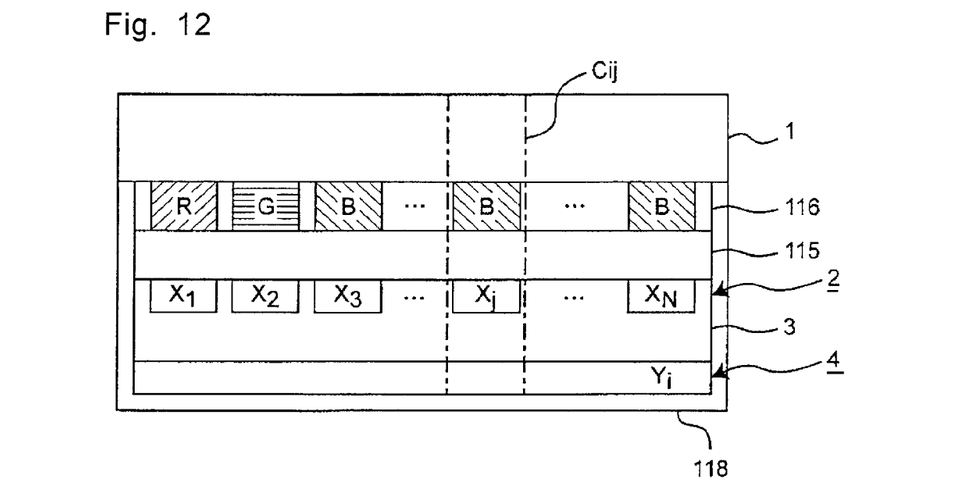
FIG. 12 is a schematic diagram showing a structure of a color display device in accordance with another example.

FIG. 12 is a cross-sectional view showing a structure of a display unit of a color display device of another example. The color display device of this example further includes a color conversion layer 115 and a color filter 116 between the substrate 1 and a plurality of data electrodes 4. The color conversion layer 115 is formed between the phosphor layer 3 and the color filter 116 so that light from the phosphor layer 3 is converted to white light. The color filter 116 is provided with one of the filters of red filter R, green filter G, and blue filter B for each one of the data electrodes 1. White light from the color conversion layer 115 is allowed to pass through the red filter R, green filter G, and blue filter B such that the respective red color light, green color light, and blue color light are transmitted and displayed.

The present invention is not limited to the above-mentioned structure, and modifications may be made appropriately to provide other structures in which a plurality of phosphor layers 3 are formed, a plurality of dielectric layers may be formed between the electrode and the phosphor layer 3 so as to regulate an electric current, an alternate current power supply is used for driving, both the scanning electrodes and data electrodes are formed into transparent electrodes, electrodes on either of the sides are formed into black color electrodes, a structure is further provided in which all the portions or some portions of the display device 100 are sealed, and a structure is further formed in which a color conversion layer or the like that converts the color of light emission from the phosphor layer 3 is further provided in front thereof in a taking-out direction of the light emission.

<Controlling Method of Display Device>

At a pixel $C_{ij}$ selected by the scanning electrode 2 and the data electrode 4, upon application of a voltage that is larger than the light emission starting voltage to the phosphor layer 3, a current is allowed to flow within the phosphor layer 3, so that light emission is given from the phosphor layer 3 of the selected pixel $C_{ij}$.

(a) First, image data S1 is inputted to the control unit 103.
(b) Next, the control unit 103 drives the data electrode driving circuit 121 and the scanning electrode driving circuit 122 with respect to each of the pixels based upon information as to whether or not the corresponding pixel should be caused to emit light.
(c) The scanning electrode driving circuit 122 applies a voltage to the scanning electrode 2 corresponding to the pixel $C_{ij}$ to emit light.
(d) The data electrode driving circuit 121 applies a voltage to the data electrode 4 corresponding to the pixel $C_{ij}$ to emit light.
(e) When a voltage that is equal to or larger than the light emission starting voltage is applied to the phosphor layer 3 at the pixel $C_{ij}$ where the voltage-applied scanning electrode 2 and data electrode 4 intersect with each other, a current is passed within the phosphor layer 3, thereby causing the phosphor layer 3 of the selected pixel $C_{ij}$ to emit light.

With respect to the method for causing a desired pixel among a plurality of pixels to emit light, for example, a method in which a voltage is applied to selected one of scanning electrodes and selected one of data electrodes so as to cause each pixel to emit light and a line sequential scanning method in which a voltage is applied to selected one of the scanning electrodes and selected one or a plurality of data electrodes so that light emission is carried out for each scanning electrode, may be applied.

The following description is made to discuss one example of a method for manufacturing a display device in accordance with first embodiment. In the same manner as in FIG. 9, this example has a structure in which data electrodes $X_i$ are prepared as back electrodes 4 and scanning electrodes $Y_j$ are prepared as transparent electrodes 2. With respect to the above-described phosphor layer 3 made of another material also, the same manufacturing method may be applied.

(1) First, Corning 1737 is prepared as a substrate 1.
(2) Data electrodes $X_i$ (back electrodes 4) are formed on the substrate 1. For example, Al is used to be formed into substantially parallel patterned electrodes at predetermined intervals by using a photolithography method. The film thickness is set to 200 nm.
(3) A phosphor layer 3 is formed on the substrate 1. Powdered ZnS and $Cu_2S$ are each charged into a plurality of evaporating sources, and an electron beam is applied to each of the materials in vacuum (about $10^{-6}$ Torr) so as to be film-formed on the substrate 1 as a phosphor layer 3. At this time, the substrate temperature is set to 200° C. so that ZnS and $Cu_2S$ are commonly vapor deposited.
(4) After forming the phosphor layer 3, the film is subjected to firing at 700° C. for about one hour in a sulfur atmosphere. By examining this film by using the X-ray diffraction and the SEM, the polycrystalline structure with minute ZnS crystal grains and the segregated portion of $Cu_xS$ on the grain boundary of the polycrystalline structure can be observed. Although the reason has not been clarified, it is considered that a phase separation occurs between ZnS and $Cu_xS$, with the result that the above-described segregated structure is formed.
(5) Subsequently, by using, for example, ITO, scanning electrodes $Y_j$ (transparent electrodes 2) are formed into a pattern. These scanning electrodes $Y_j$ (the transparent electrodes 2) are formed virtually in parallel with one another at predetermined intervals, so as to be virtually orthogonal to an extending direction of the data electrodes $X_i$. The film thickness of the scanning electrodes $Y_j$ is set to 200 nm.

(6) Next, a transparent insulator layer made of, for example, silicon nitride or the like is formed on the phosphor layer 3 and the data electrodes $Y_j$ as a protective layer (not shown in the figure).

Through the above processes, the display device 100 in accordance with the present embodiment is obtained.

Being different from a conventional EL element, there is no need for application of a high AC voltage for this display device, and sufficient light emission luminance required can be obtained by using a DC voltage of about 5 to 10 V.

In the case of a color display device, the phosphor layers may be film-formed with different colors by using phosphors having respective colors of RGB. Alternatively, light emitting units, each having a transparent electrode/phosphor layer/back electrode, may be laminated for the respective colors of RGB. Moreover, in the case of a color display device of another example, after manufacturing a display device using a phosphor layer of a single color or two colors, the respective colors of RGB may be displayed by using color filters and/or color conversion filters.

<Effects>

Being different from the conventional display device, there is no need for application of a high AC voltage for the display device in accordance with the present embodiment, and sufficient light emission luminance required can be obtained by using a low DC voltage.

The light emitting device of the present invention is capable of emitting light at a low voltage and provides light emission with high luminance. The light emitting device is effectively applied, in particular, to display devices such as televisions and the like, as well as to various light sources used for communication, illumination, and the like.

The display device of the present invention makes it possible to provide a display device that can provide an image display with high luminance through low voltage driving. The display device is effectively applied, in particular, to display devices for digital cameras, car navigation systems, and televisions.

The invention claimed is:

1. A light emitting device comprising:
a pair of electrodes, at least one of the electrodes being transparent or translucent; and
a phosphor layer that is sandwiched between the electrodes and has a polycrystalline structure made of a first semiconductor material,
wherein a second semiconductor material is disproportionately separated on a grain boundary of the polycrystalline structure,
wherein the first semiconductor material has an n-type semiconductor structure, and the second semiconductor material has a p-type semiconductor structure.

2. The light emitting device according to claim 1, wherein the first semiconductor material and the second semiconductor material are compound semiconductors.

3. The light emitting device according to claim 2, wherein the first semiconductor material is a compound semiconductor located between Group 12 and Group 16.

4. The light emitting device according to claim 1, wherein the first semiconductor material has a cubic crystal structure.

5. The light emitting device according to claim 1, wherein the first semiconductor material contains at least one kind of element selected from the group consisting of Cu, Ag, Au, Al, Ga, In, Mn, Cl, Br, I, Li, Ce, Pr, Nd, Pm, Sm, Eu, Gd, Tb, Dy, Ho, Er, Tm, and Yb.

6. The light emitting device according to claim 1, wherein the first semiconductor material has a polycrystalline structure having an average crystal grain size in a range from 5 nm to 500 nm.

7. The light emitting device according to claim 1, wherein the first semiconductor material is a zinc-based material containing zinc, and at least one of the paired electrodes is made of a material containing zinc.

8. The light emitting device according to claim 7, wherein the material containing zinc that forms one of the electrodes mainly contains zinc oxide and contains at least one kind selected from the group consisting of aluminum, gallium, titanium, niobium, tantalum, tungsten, copper, silver, and boron.

9. The light emitting device according to claim 1, further comprising a supporting substrate that is made in contact with at least one of faces of the electrode to support the electrode.

10. The light emitting device according to claim 1, further comprising a color conversion layer that is made face to face with the paired electrodes and disposed in front of the phosphor layer in a taking-out direction of light emission therefrom.

11. A display device comprising:
a substrate;
a plurality of scanning electrodes extended on the substrate in a first direction in parallel with one another;
a plurality of data electrodes extended in a second direction perpendicular to the scanning electrodes, in parallel with one another; and
at least one phosphor layer sandwiched between the scanning electrodes and the data electrodes,
wherein at least one group of the scanning electrodes and the data electrodes is transparent or translucent, and the phosphor layer has a polycrystalline structure made of a first semiconductor material with a second semiconductor material being disproportionately separated on a grain boundary of the polycrystalline structure,
wherein the first semiconductor material has an n-type semiconductor structure, and the second semiconductor material has a p-type semiconductor structure.

12. The display device according to claim 11, wherein the first semiconductor material and the second semiconductor material are compound semiconductors.

13. The display device according to claim 11, wherein the first semiconductor material is a compound semiconductor located between Group 12 to Group 16.

14. The display device according to claim 11, wherein the first semiconductor material has a cubic crystal structure.

15. The display device according to claim 11, wherein the first semiconductor material contains at least one kind of element selected from the group consisting of Cu, Ag, Au, Al, Ga, In, Mn, Cl, Br, I, Li, Ce, Pr, Nd, Pm, Sm, Eu, Gd, Tb, Dy, Ho, Er, Tm, and Yb.

16. The display device according to claim 11, wherein the first semiconductor material has a polycrystalline structure having an average crystal grain size in a range from 5 nm to 500 nm.

17. The display device according to claim 11, wherein the second semiconductor material is any of $Cu_2S$, ZnS, ZnSe, ZnSSe, ZnSeTe, ZnTe, GaN, and InGaN.

18. The display device according to claim 11, wherein the first semiconductor material is a zinc-based material containing zinc, and at least one of the paired electrodes is made of a material containing zinc.

19. The display device according to claim 18, wherein the material containing zinc that forms one of the electrodes mainly contains zinc oxide and contains at least one kind selected from the group consisting of aluminum, gallium, titanium, niobium, tantalum, tungsten, copper, silver, and boron.

20. The display device according to claim 11, further comprising a supporting substrate that is made in contact with at least one of faces of the electrode to support the electrode.

21. The display device according to claim 11, further comprising a color conversion layer that is made face to face with the electrodes and disposed in front thereof in a taking-out direction of light emission.

* * * * *